United States Patent
Brewer

(10) Patent No.: US 12,113,482 B2
(45) Date of Patent: Oct. 8, 2024

(54) AMPLIFIER DEVICE PACKAGES INCORPORATING INTERNAL COUPLERS

(71) Applicant: MACOM Technology Solutions Holdings, Inc., Lowell, MA (US)

(72) Inventor: Kenneth Brewer, Mesa, AZ (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 460 days.

(21) Appl. No.: 17/518,883

(22) Filed: Nov. 4, 2021

(65) Prior Publication Data

US 2023/0140451 A1 May 4, 2023

(51) Int. Cl.
*H03F 1/02* (2006.01)
*H01L 23/66* (2006.01)
*H03F 3/195* (2006.01)

(52) U.S. Cl.
CPC .......... *H03F 1/0205* (2013.01); *H01L 23/66* (2013.01); *H03F 3/195* (2013.01); *H01L 2223/6655* (2013.01); *H03F 2200/198* (2013.01); *H03F 2200/451* (2013.01)

(58) Field of Classification Search
CPC .. H03F 1/0205; H03F 3/195; H03F 2200/198; H03F 2200/451; H03F 2200/192; H03F 2200/204; H03F 3/211; H03F 1/0288; H03F 3/245; H01L 23/66; H01L 2223/6655; H01L 23/047; H01L 23/3107; H01L 25/18
USPC ...................... 330/295, 124 R, 307
See application file for complete search history.

(56) References Cited

U.S. PATENT DOCUMENTS 7,064,606 B2 * 6/2006 Louis ...................... H03F 3/602
330/53
9,647,611 B1 * 5/2017 Embar .................. H03F 1/0288

* cited by examiner

*Primary Examiner* — Hieu P Nguyen
(74) *Attorney, Agent, or Firm* — Myers Bigel, P.A.

(57) ABSTRACT

An amplifier package includes a plurality of input leads, a plurality of transistor amplifiers having inputs respectively coupled to one of the plurality of input leads, and a quadrature hybrid coupler within the amplifier package and coupled between the plurality of input leads and the plurality of transistor amplifiers, wherein the quadrature hybrid coupler is configured to divide an input signal received from a first of the plurality of input leads between the plurality of transistor amplifiers.

22 Claims, 13 Drawing Sheets

AMPLIFIER DEVICE PACKAGES INCORPORATING INTERNAL COUPLERS

FIELD

The present disclosure relates to transistor devices and, more particularly, to transistor amplifiers and related device packages.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, high efficiency, good linearity and handle high output power levels.

Some transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based transistor amplifiers are often implemented using laterally diffused metal oxide semiconductor ("LDMOS") transistors. Silicon LDMOS transistor amplifiers can exhibit high levels of linearity and may be relatively inexpensive to fabricate. Group III nitride-based transistor amplifiers are often implemented as High Electron Mobility Transistors ("HEMT") and are primarily used in applications requiring high power and/or high frequency operation where LDMOS transistor amplifiers may have inherent performance limitations.

Transistor amplifiers are often packaged and sold as packaged transistor amplifiers. A packaged transistor amplifier may include a single transistor amplifier chip or "die" or may include a plurality of transistor amplifier chips. Multiple transistor amplifier chips are typically used in transistor amplifiers having multiple amplification stages, where each stage is typically implemented as a separate transistor amplifier chip. In order to increase the output power and current handling capabilities, transistor amplifier dies are typically implemented in a "unit cell" configuration in which a large number of individual "unit cell" transistors are arranged electrically in parallel. An amplifier package may include a single die or may include a plurality of dies.

Packaged transistor amplifiers are often utilized in conjunction with discrete coupling devices. For example, the coupling devices may distribute an input signal to a plurality of packaged transistor amplifiers and/or may combine output signals from a plurality of packaged transistor amplifiers. For example, a directional coupler such as a 90-degree hybrid coupler (also referred to as a quadrature coupler) may be used in conjunction with multiple discrete packaged transistor amplifiers. A branch line coupler is one example of a 90-degree hybrid coupler.

FIG. 1A is a schematic diagram of a conventional quadrature hybrid coupler 18. A quadrature hybrid coupler 18 is a four-port device that may be used to split an input signal into two equal amplitude, isolated quadrature outputs and/or to combine two quadrature phased, equal amplitude signals into a single output.

A quadrature hybrid coupler 18 is a symmetrical device in that signals applied to any port will split equally between an opposite pair of ports. In FIG. 1A, it has been assumed that the port 1 is the input port. In this case, an input signal will be split into sub-components that are output at ports 2 and 3, and port 4 is an "isolated" port, as will be explained below. When a signal having a magnitude of A volts is input at port 1, the quadrature hybrid coupler divides the signal into two sub-components that are output at ports 2 and 3. As shown in FIG. 1A, the voltage (magnitude, phase) of the sub-component output at port 2 is equal to (A/$\sqrt{2}$, X°) and the voltage of the sub-component output at port 3 is equal to (A/$\sqrt{2}$, X°−90°). Thus, the magnitude of the voltages of the RF sub-components output at ports 2 and 3 will be equal, but the phase will always differ by 90°. Herein, port 1 may be referred to as the input port, port 2 may be referred to as a through port or as an output port, and port 3 may be referred to as a coupled port or an output port, and port 4 may be referred to as an isolated port.

Two quadrature couplers 18_1, 18_2 may be connected in series, as shown in FIG. 1B. If an RF signal having a magnitude of A volts is input to port 1 of quadrature coupler 18_1, the voltage (magnitude, phase) of the signal output at port 2 of quadrature coupler 18_1 is (A/$\sqrt{2}$, X°) and the voltage of the signal output at port 3 is (A/$\sqrt{2}$, X°−90°). When the RF signals output at ports 2 and 3 of quadrature coupler 18_1 are input to ports 1 and 4, respectively, of quadrature coupler 18_2, the voltage of the signal output at port 2 of quadrature coupler 18_2 in response to the signal input at port 1 of quadrature coupler 18_2 is (A/2, X°−180°) and the voltage of the signal output at port 2 of quadrature coupler 18_2 in response to the signal input at port 4 of quadrature coupler 18_2 is (A/2, X°−360°). As these two signals have equal magnitudes and opposite phases, they cancel each other out, such that no power (assuming ideal behavior) is output from port 2 of quadrature coupler 18_2. The voltage of the signal output at port 3 of quadrature coupler 18_2 in response to the signal input at port 1 of quadrature coupler 18_2 is (A/2, X°−270°), and the voltage of the signal output at port 3 of quadrature coupler 18_2 in response to the signal input at port 4 of quadrature coupler 18_2 is (A/2, X°−270°). As these two signals have equal magnitudes and equal phases, they constructively combine to provide a signal having magnitude A.

A useful characteristic of a quadrature hybrid coupler 18 is its reaction to impedance mismatches. In the case of a common input mismatch, all reflections are directed to port 4 (also referred to as the isolated port) in FIG. 1A, and, as a result system match is not affected when port 4 is terminated in its characteristic impedance. The same condition holds true for output mismatches, reflections are directed to the isolated port 4. The standard quadrature hybrid coupler 18 may also be used to combine two input signals at ports 2 and 3 into an output signal at port 4, with port 1 acting as an isolated port. Thus, when acting as a signal divider, the quadrature hybrid coupler 18 may have an input port, two output ports (with one of the output ports being out-of-phase with the input port), and an isolated port that outputs reflections or differences between the other ports. When acting as a signal combiner, the quadrature hybrid coupler 18 may have two input ports, one output port (with the output port being out-of-phase with one of the input ports), and an isolated port that outputs reflections or differences between the other ports. It should be noted that any of ports 1-4 may act as the input port of the quadrature hybrid coupler 18, and the other ports then become the through port, the coupled port and the isolated port.

FIG. 1C is a schematic diagram illustrating an example of the use of the quadrature hybrid coupler 18 in a transistor amplifier configuration 10. As shown in FIG. 1C, the transistor amplifier configuration 10 includes an RF input 11, a first quadrature hybrid coupler 18_1, a first amplifier 14, a second amplifier 15, a second quadrature hybrid coupler 18_2, and an RF output 19. The transistor amplifier configuration 10 may optionally include input matching networks and/or output matching networks (not shown). Applying the transfer function for the quadrature hybrid coupler 18 shown in FIG. 1A, it can be seen that the first quadrature hybrid coupler 18_1 is used to divide an input signal that is received at RF input 11 into two sub-components that are amplified by the respective first and second amplifiers 14, 15, and the outputs of the two amplifiers 14, 15 are constructively combined by the second quadrature hybrid coupler 18_2 and output at RF output 19.

As illustrated in FIG. 1A, the first quadrature hybrid coupler 18_1 may serve as a divider to split the input signal 11 into equal signals that are passed to the first and second amplifiers 14, 15. The second quadrature hybrid coupler 18_2 may act as a combiner to combine the output from the first and second amplifiers 14, 15 to provide the output signal 19.

In FIG. 1C, circuit elements 17 having pre-selected characteristics impedances are provided and connected to the isolated ports of the first and second quadrature hybrid couplers 18_1, 18_2. For example, resistors having nominal 50Ω impedances may be coupled to the respective isolated ports.

For the configuration of FIG. 1C, one or more discrete amplifier packages may be utilized to provide the first and second amplifiers 14, 15. In FIG. 1C, the package boundaries are illustrated schematically as dotted lines, with the outputs of the first quadrature hybrid coupler 18_1 coupled to inputs of respective ones of the amplifier packages and outputs of respective ones of the amplifier packages coupled to inputs of the second quadrature hybrid coupler 18_2.

FIG. 1D illustrates a transistor amplifier configuration 10' that is similar to that of FIG. 1C, with the first and second amplifiers 14, 15 combined in a single package (illustrated by a dotted line). In FIG. 1D, the outputs of the first quadrature hybrid coupler 18_1 may be coupled to respective leads of the amplifier package which are, in turn, coupled to the first and second amplifiers 14, 15. The outputs of the first and second amplifiers 14, 15 may be similarly coupled to output leads of the amplifier package, which are in turn coupled to inputs of the second quadrature hybrid coupler 18_2.

For both of the transistor amplifier configurations 10, 10' of FIGS. 1C and 1D, use of the first and second amplifiers 14, 15 may involve placement of the amplifier packages associated with the first and second amplifiers 14, 15, placement of the packages associated with the first and second quadrature hybrid couplers 18_1, and 18_2, and coupling therebetween. This complex placement may increase the amount of space utilized by the configuration, and the interconnections may increase a power loss of the configuration.

SUMMARY

Embodiments of the present disclosure relate to amplifier packages incorporating internal quadrature hybrid couplers.

Pursuant to some embodiments of the present invention, amplifier packages are provided that comprise a plurality of input leads, a plurality of transistor amplifiers having inputs respectively coupled to one of the plurality of input leads, and a quadrature hybrid coupler within the amplifier package and coupled between the plurality of input leads and the plurality of transistor amplifiers. The quadrature hybrid coupler is configured to divide an input signal received from a first of the plurality of input leads between the plurality of transistor amplifiers.

In some embodiments, the amplifier package comprises an overmold plastic (OMP) package.

In some embodiments, the amplifier package may further comprise a submount, and the plurality of transistor amplifiers and the quadrature hybrid coupler may be on the submount.

In some embodiments, the quadrature hybrid coupler may comprise a plurality of ports, and a first port of the plurality of ports may be coupled to the first of the plurality of input leads and a second port of the plurality of ports may be coupled to a second of the plurality of input leads. In some embodiments, the second port of the plurality of ports may be an isolated port of the quadrature hybrid coupler.

In some embodiments, the amplifier package may further comprise an input prematch circuit between the quadrature hybrid coupler and a first transistor amplifier of the plurality of transistor amplifiers.

In some embodiments, the quadrature hybrid coupler may be a first quadrature hybrid coupler, and the amplifier package may further comprise a plurality of output leads and a second quadrature hybrid coupler within the amplifier package and coupled between the plurality of output leads and the plurality of transistor amplifiers. The second quadrature hybrid coupler may be configured to combine an output signal received from the plurality of transistor amplifiers.

In some embodiments, the second quadrature hybrid coupler may comprise a plurality of ports, and a first port of the plurality of ports may be coupled to the first of the plurality of output leads and a second port of the plurality of ports may be coupled to a second of the plurality of output leads.

In some embodiments, the quadrature hybrid coupler may be a first quadrature hybrid coupler, and the amplifier package may further comprise a second quadrature hybrid coupler within the amplifier package and coupled between the first quadrature hybrid coupler and a subset of the plurality of transistor amplifiers. The second quadrature hybrid coupler may be configured to divide an output signal received from the first quadrature hybrid coupler between the subset of the plurality of transistor amplifiers.

Pursuant to further embodiments of the present invention, amplifier packages are provided that comprise a first input lead and a second input lead, a submount, a first transistor amplifier and a second transistor amplifier on the submount and a quadrature hybrid coupler on the submount. The quadrature hybrid coupler comprises an input port, a first output port, a second output port, and an isolated port, where the input port is coupled to the first input lead, the isolated port is coupled to the second input lead, the first output port is coupled to the first transistor amplifier, and the second output port is coupled to the second transistor amplifier.

In some embodiments, the amplifier package may further comprise an input prematch circuit between the first output port of the quadrature hybrid coupler and the first transistor amplifier.

In some embodiments, the quadrature hybrid coupler may be a first quadrature hybrid coupler, and the amplifier package may further comprise a first output lead and a second output lead and a second quadrature hybrid coupler on the submount. The second quadrature hybrid coupler may comprise a first input port, a second input port, an output port, and an isolated port, where the first input port of the second quadrature hybrid coupler is coupled to the first transistor amplifier, the second input port of the second quadrature hybrid coupler is coupled to the second transistor amplifier, the isolated port of the second quadrature hybrid coupler is coupled to the first output lead, and the output port of the second quadrature hybrid coupler is coupled to the first output lead.

In some embodiments, the amplifier package may further comprise an output prematch circuit between the first input port of the second quadrature hybrid coupler and the first transistor amplifier.

In some embodiments, the quadrature hybrid coupler may be a first quadrature hybrid coupler, the first transistor amplifier may be a plurality of first transistor amplifiers, and the amplifier package may further comprise a second quadrature hybrid coupler within the amplifier package and coupled between the first quadrature hybrid coupler and the plurality of first transistor amplifiers. The second quadrature hybrid coupler may be configured to divide an output signal received from the first quadrature hybrid coupler between respective ones of the plurality of first transistor amplifiers.

In some embodiments, the amplifier package may be an OMP package in which an overmold material at least partially encapsulates the first transistor amplifier, the second transistor amplifier, and the quadrature hybrid coupler.

In some embodiments, the isolated port may be configured to output signal reflections from the first output port and the second output port.

Pursuant to still further embodiments of the present invention, amplifier packages are provided that comprise a plurality of input leads and a plurality of output leads, a plurality of transistor amplifiers internal to the amplifier package, and a plurality of quadrature hybrid couplers internal to the amplifier package and coupled to the plurality of transistor amplifiers, each of the plurality of quadrature hybrid couplers comprising an isolated port coupled to one of the plurality of input leads or one of the plurality of output leads.

In some embodiments, the amplifier package may be an OMP package.

In some embodiments, the amplifier package may further comprise a submount, and the plurality of transistor amplifiers and the plurality of quadrature hybrid couplers may be on the submount.

In some embodiments, the plurality of quadrature hybrid couplers may comprise a first quadrature hybrid coupler and a second quadrature hybrid coupler, each comprising a plurality of ports, where a first port of the plurality of ports of the first quadrature hybrid coupler is coupled to the one of the plurality of input leads and a second port of the plurality of ports of the first quadrature hybrid coupler is coupled to another one of the plurality of input leads, and where a first port of the plurality of ports of the second quadrature hybrid coupler is coupled to the one of the plurality of output leads and a second port of the plurality of ports of the second quadrature hybrid coupler is coupled to another one of the plurality of output leads.

In some embodiments, the second port of the plurality of ports of the first and second quadrature hybrid coupler may be an isolated port.

In some embodiments, the amplifier package may further comprise an input prematch circuit between the first quadrature hybrid coupler and a first transistor amplifier of the plurality of transistor amplifiers and an output prematch circuit between the second quadrature hybrid coupler and the first transistor amplifier of the plurality of transistor amplifiers.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

DETAILED DESCRIPTION

The present disclosure describes a device and package in which one or more quadrature hybrid couplers are included inside a packaged device that further includes transistor amplifiers. Inputs and/or outputs of the quadrature hybrid couplers may be connected to leads of the package. For example, one or more ports (including a port that may be designated as an isolated port) of the quadrature hybrid coupler may be connected to a lead of the package and exposed as an input or output of the package.

Embodiments of the present disclosure may provide beneficial solutions over configurations in which discrete packaged transistor amplifiers and discrete packaged quadrature hybrid couplers are combined. Quadrature hybrid couplers provide benefits such as improved impedances, and the ability to select an output path by changing the input path. Having unterminated quadrature hybrid couplers on the input and output of a discrete device may enable smaller, lower-cost, and more robust power amplifier designs for systems with multi-stage designs, and/or those systems which require output diversity.

According to some embodiments of the present disclosure, a package incorporating one or more internal quadrature hybrid couplers may provide a number of advantages over the current devices, while allowing for less configuration circuitry and reduced space requirements. Exposure of the ports of the quadrature hybrid coupler from an amplifier package may allow for an increased number of configuration options for users of such a package.

Figure 1A:
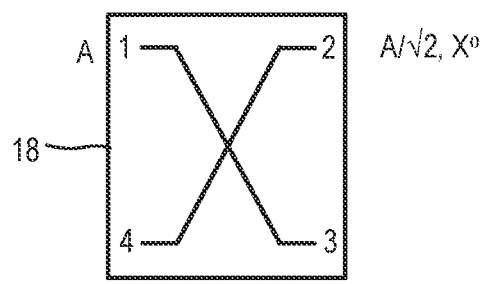
FIGS. 1A to 1D are schematic diagrams of hybrid quadrature couplers and amplifier configurations incorporating the same.
Figure 1B:
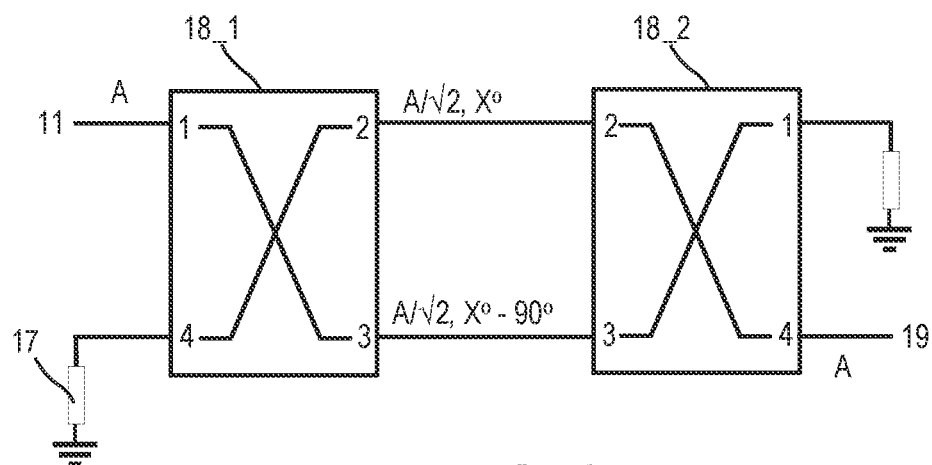
Figure 1C:
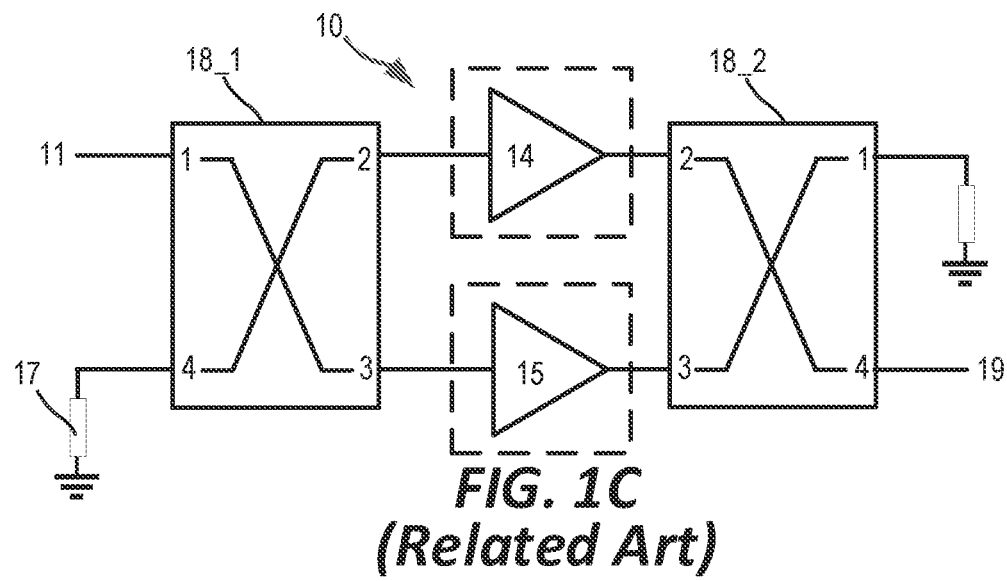
Figure 1D:
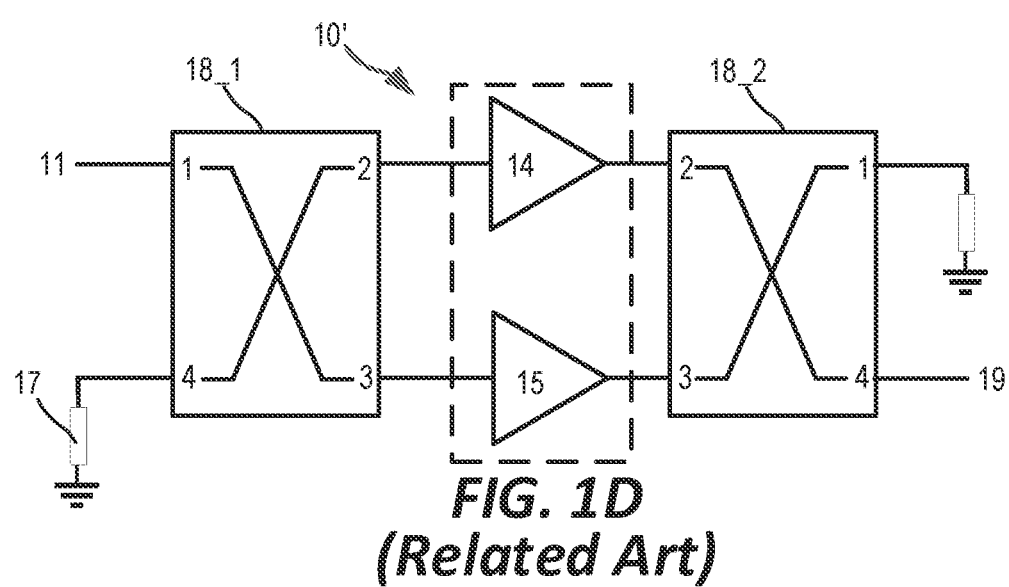
Figure 2A:
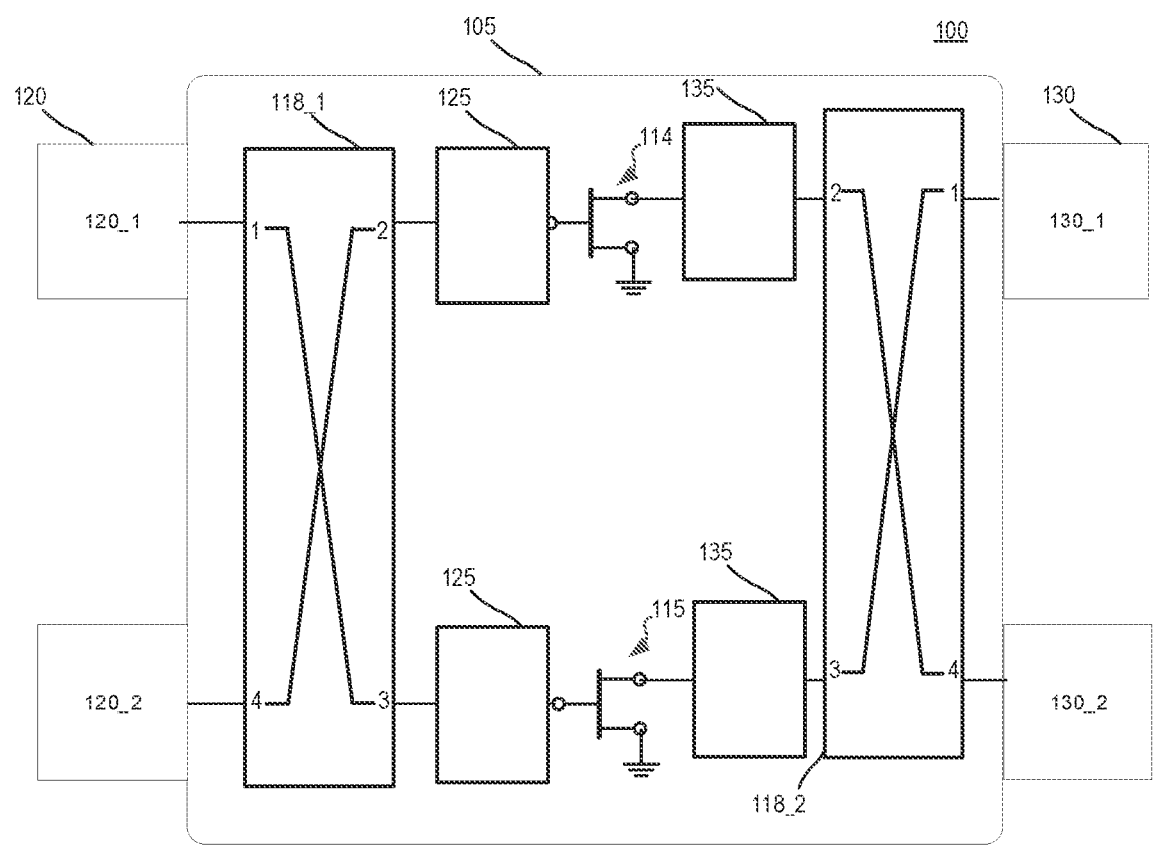
FIGS. 2A to 2C are schematic diagrams of amplifier packages according to some embodiments of the present disclosure.
Figure 2B:
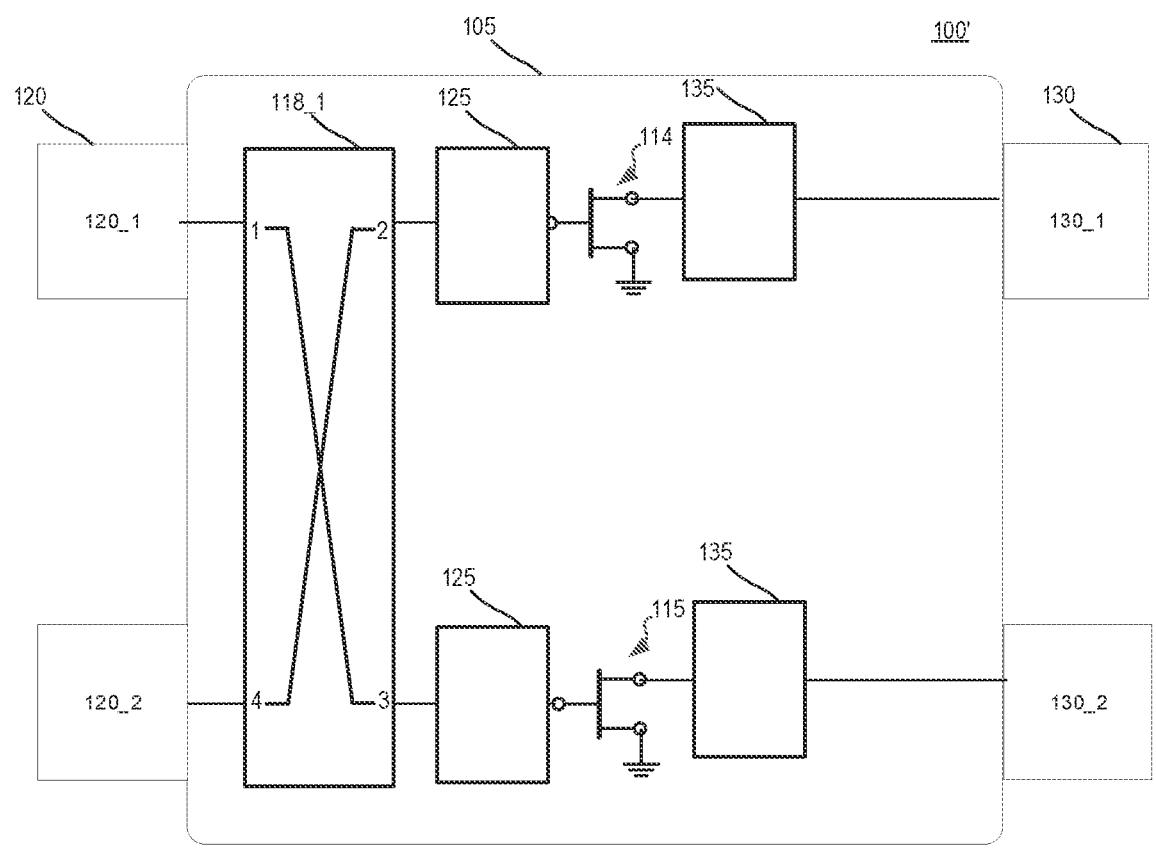
Figure 2C:
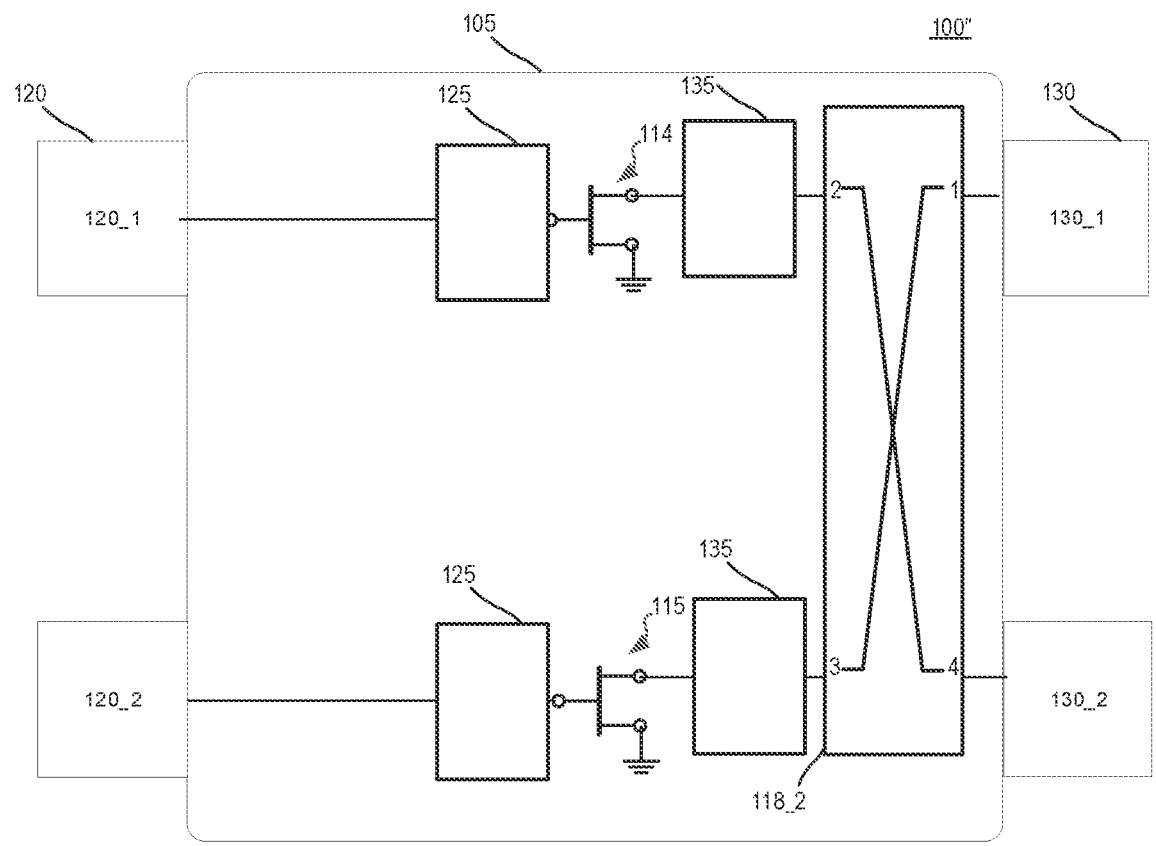

FIGS. 2A to 2C are schematic diagrams of amplifier packages according to some embodiments of the present disclosure.

Referring to FIG. 2A, an amplifier package 100 according to some embodiments of the present disclosure may include a plurality of transistor amplifiers such as one or more first transistor amplifiers 114 and one or more second transistor amplifiers 115. In FIG. 2A, one first transistor amplifier 114 and one second transistor amplifier 115 are illustrated, but the present disclosure is not limited thereto. For example, in other embodiments, two first transistor amplifiers 114 may be provided in series, and/or two second transistor amplifiers 115 may be provided in series.

In some embodiments, the amplifier package 100 may be a balanced amplifier with similarly biased first and second transistor amplifiers 114, 115. In some embodiments, the amplifier package 100 may be a Doherty amplifier, and the one or more first transistor amplifiers 114 may be main amplifiers and the one or more second transistor amplifiers 115 may be peaking amplifiers. In such embodiments, the one or more first transistor amplifiers 114 may be biased differently than the one or more second transistor amplifiers 115.

The one or more first transistor amplifiers 114 and the one or more second transistor amplifiers 115 may be disposed on a submount 105 of the amplifier package 100. In some embodiments, the submount 105 may include materials configured to assist with the thermal management of the amplifier package 100. For example, the submount 105 may include copper and/or molybdenum. In some embodiments, the submount 105 may be composed of multiple layers and/or contain vias/interconnects. In an example embodiment, the submount 105 may be a multilayer copper/molybdenum/copper metal flange that comprises a core molybdenum layer with copper cladding layers on either major surface thereof. In some embodiments, the submount 105 may include a metal heat sink that is part of a lead frame or metal slug.

Though not expressly illustrated in FIG. 2A, the amplifier package 100 may include sidewalls to form an open cavity into which the first and second transistor amplifiers 114, 115 are placed and/or the amplifier package 100 may include a plastic overmold that at least partially surrounds the first and second transistor amplifiers 114, 115. As used herein, an "inside" or "internal" portion of the amplifier package 100 is considered to include areas within sidewalls of the amplifier package 100 and/or encapsulated by a material (e.g., an overmold material) of the amplifier package 100.

The amplifier package 100 may include input leads 120 and output leads 130. The input leads 120 and the output leads 130 may be configured to extend from the internal portion of the amplifier package 100 to allow for external coupling of signals to the amplifier package 100.

The input leads 120 may be coupled to a first quadrature hybrid coupler 118_1. For example, a first input lead 120_1 may be coupled to a first port (e.g., an input port) of the first quadrature hybrid coupler 118_1 and a second input lead 120_2 may be coupled to a second port (e.g., an isolated port) of the first quadrature hybrid coupler 118_1.

In some embodiments, input prematch circuits 125 may be coupled between the first quadrature hybrid coupler 118_1 and input terminals (e.g., gates) of respective ones of the first or second transistor amplifiers 114, 115. Each input prematch circuit 125 may be configured to perform input impedance matching and/or harmonic termination, as well as other input signal conditioning functions. In some of the embodiments, the input prematch circuits 125 may be identical or may be different from one another. That is to say that a first input prematch circuit 125 coupled to one of the first transistor amplifiers 114 may be different from a second input prematch circuit 125 coupled to one of the second transistor amplifiers 115 and/or another of the first transistor amplifiers 114, when multiple first transistor amplifiers 114 are present.

A first of the input prematch circuits 125 that is coupled between the first transistor amplifier 114 and the first quadrature hybrid coupler 118_1 may be coupled to a first output port of the first quadrature hybrid coupler 118_1. A second of the input prematch circuits 125 that is coupled between the second transistor amplifier 115 and the first quadrature hybrid coupler 118_1 may be coupled to a second output port of the first quadrature hybrid coupler 118_1. Thus, an input signal provided to the first or second input leads 120_1, 120_2 may pass through the first quadrature hybrid coupler 118_1 and be split between the two output ports of the first quadrature hybrid coupler 118_1. The split signals may then be transmitted through the input prematch circuits 125 to the first and second transistor amplifiers 114, 115, respectively.

The output leads 130 may be coupled to a second quadrature hybrid coupler 118_2. For example, a first output lead 130_1 may be coupled to a first port (e.g., an isolated port) of the second quadrature hybrid coupler 118_2 and a second output lead 130_2 may be coupled to a second port (e.g., an output port) of the second quadrature hybrid coupler 118_2.

In some embodiments, an output prematch circuit 135 may be coupled between the second quadrature hybrid coupler 118_2 and output terminals (e.g., drains) of respective ones of the first or second transistor amplifiers 114, 115. The output prematch circuit 135 may be configured to perform output impedance matching and/or harmonic termination, as well as other output signal conditioning functions. In some of the embodiments, the output prematch circuits 135 may be identical or may be different from one another. That is to say that a first output prematch circuit 135 coupled to one of the first transistor amplifiers 114 may be different from a second output prematch circuit 135 coupled to one of the second transistor amplifiers 115 and/or another of the first transistor amplifiers 114, when multiple first transistor amplifiers 114 are present.

A first of the output prematch circuits 135 that is coupled between the first transistor amplifier 114 and the second quadrature hybrid coupler 118_2 may be coupled to a first input port of the second quadrature hybrid coupler 118_2. A second of the output prematch circuits 135 that is coupled between the second transistor amplifier 115 and the second quadrature hybrid coupler 118_2 may be coupled to a second input port of the second quadrature hybrid coupler 118_2. Thus, output signals from the first and second transistor amplifiers 114, 115 may pass through the output prematch circuits 135 and be combined by the second quadrature hybrid coupler 118_2 and output to one of the output leads 130_1, 130_2 that are coupled to the second quadrature hybrid coupler 118_2.

During operation of the amplifier package 100, an input signal provided to one of the input leads (e.g., first input lead 120_1) may result in an output signal provided at one of the output leads (e.g., second output lead 130_2) due to the use of the first and second quadrature hybrid couplers 118_1, 118_2. As will be discussed further herein, the exposure of the isolated ports of the first and second quadrature hybrid couplers 118_1, 118_2 outside of the package may allow for customized control of the amplifier package 100.

FIG. 2A illustrates a configuration of the first and second transistor amplifiers 114, 115 and first and second quadrature hybrid couplers 118_1, 118_2 within the amplifier package 100 that is schematic and not intended to limit embodiments of the present disclosure. For example, in some embodiments, the first and second transistor amplifiers 114, 115 may be provided as discrete transistor dies on the submount 105, and the first and second quadrature hybrid couplers 118_1, 118_2 may be provided as separate discrete devices on the submount 105 internal to the amplifier package 100. However, the embodiments of the present disclosure are not limited thereto. In some embodiments, the first and second transistor amplifiers 114, 115 and the first and second quadrature hybrid couplers 118_1, 118_2 may be commonly provided on a single substrate and/or die, which may then be provided on the submount 105 internal to the amplifier package 100. As will be understood by those of ordinary skill in the art, other configurations and combinations of the first and second transistor amplifiers 114, 115 and the first and second quadrature hybrid couplers 118_1, 118_2 may be provided internal to the amplifier package 100 without deviating from the scope of the present disclosure.

Though FIG. 2A illustrates the use of the first and second quadrature hybrid couplers 118_1, 118_2 coupled to both the input and output sides of the first and second transistor amplifiers 114, 115, respectively, the embodiments of the present disclosure are not limited thereto. FIG. 2B illustrates an embodiment of an amplifier package 100', according to some embodiments of the present disclosure. FIG. 2B illustrates the amplifier package 100' in which a first quadrature hybrid coupler 118_1 is provided between the input leads 120 and the inputs of the first and second transistor amplifiers 114, 115, but a second quadrature hybrid coupler is not used.

Referring to FIG. 2B, a first quadrature hybrid coupler 118_1 may be coupled between the input leads 120 and one or more of the input prematch circuits 125 (as well as the inputs of the first and second transistor amplifiers 114, 115) as in FIG. 2A. However, in the amplifier package 100', the output prematch circuits 135 may be coupled to the output leads 130 without a second quadrature hybrid coupler therebetween. The amplifier package 100' may thus output separate signals (offset in phase) from the first and second transistor amplifiers 114, 115 through the output leads (e.g., first and second output leads 130_1, 130_2). The amplifier package 100' may allow for the user to separately manage and/or combine the output signals of the first and second transistor amplifiers 114, 115.

FIG. 2C illustrates an embodiment of an amplifier package 100", according to some embodiments of the present disclosure. FIG. 2B illustrates the amplifier package 100" in which a second quadrature hybrid coupler 118_2 is provided between the output of the first and second transistor amplifiers 114, 115 and the output leads 130, but a first quadrature hybrid coupler coupled between the input leads 120 and the first and second transistor amplifiers 114, 115 is not used as in FIG. 2A.

Referring to FIG. 2C, the second quadrature hybrid coupler 118_2 may be coupled between the output leads 130 and one or more of the output prematch circuits 135 (as well as the outputs of the first and second transistor amplifiers 114, 115) as in FIG. 2A. However, in the amplifier package 100", the input prematch circuits 125 may be coupled to the input leads 120 without a quadrature hybrid coupler therebetween. The amplifier package 100" may thus accept separate signals from the input leads 120 (e.g., first and second input leads 120_1, 120_2) which may be provided to the first and second transistor amplifiers 114, 115 through the input prematch circuits 125. Output signals from the first and second transistor amplifiers 114, 115 (e.g., through the output prematch circuits 135) may be combined by the second quadrature hybrid coupler 118_2 and provided as a combined output signal to one of the output leads 130 (e.g., second output lead 130_2) while another of the output leads 130 (e.g., first output lead 130_1) may expose the isolated port of the second quadrature hybrid coupler 118_2. The amplifier package 100" may allow for the user to separately manage the input signals provided to the amplifier package 100".

Figure 3A:
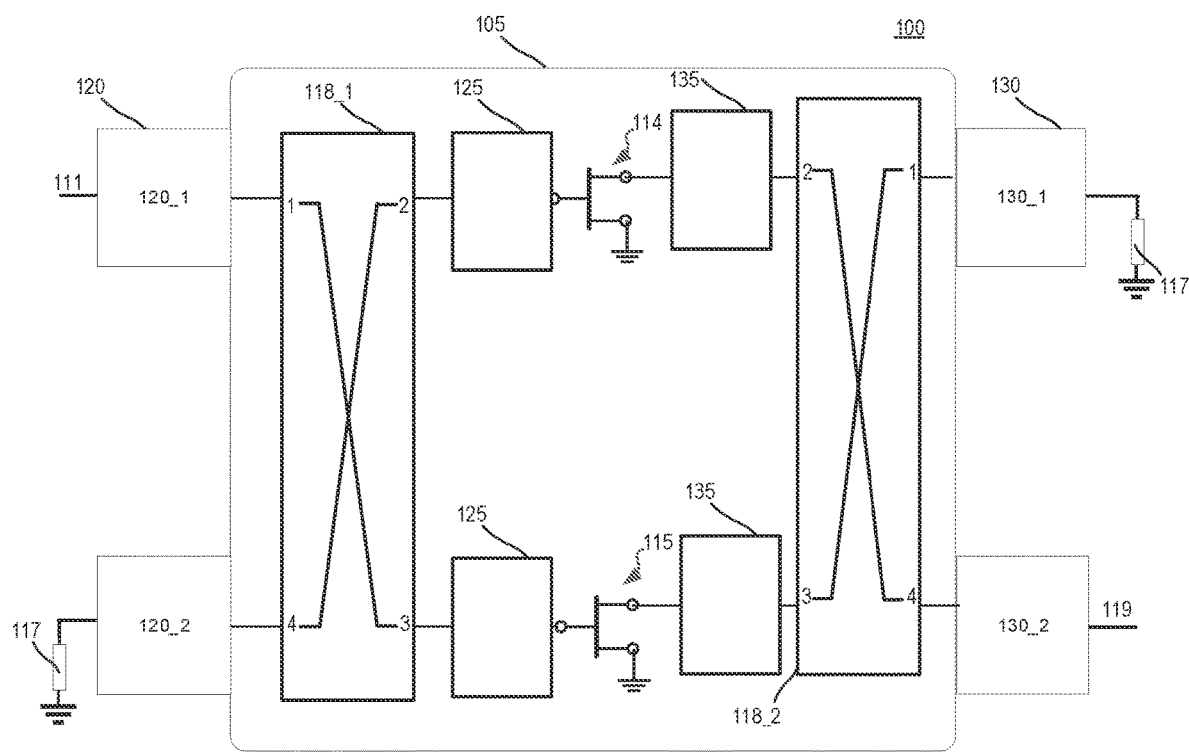
FIGS. 3A and 3B illustrate example configurations for the amplifier package of FIG. 2A, according to some embodiments of the present disclosure.
Figure 3B:
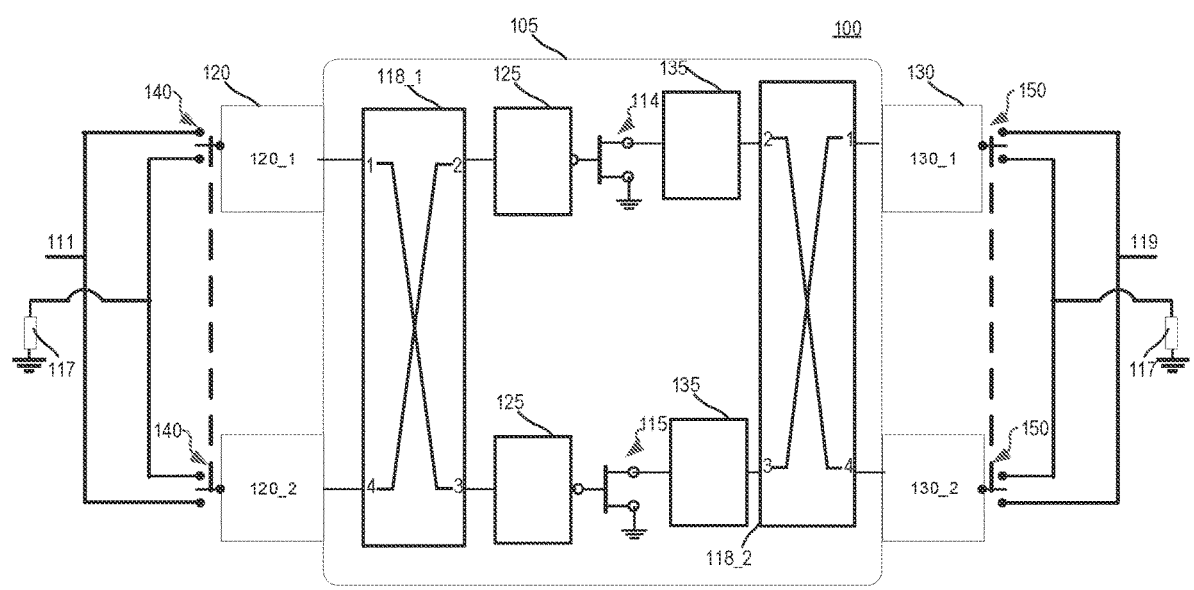

FIGS. 3A and 3B illustrate example configurations for the amplifier package 100 of FIG. 2A, according to some embodiments of the present disclosure.

In FIG. 3A, an amplifier package 100 is illustrated showing connections that illustrate the improved operation of the amplifier package 100 according to embodiments of the present disclosure. Referring to FIG. 3A, an RF input signal 111 is coupled to a first of the input leads 120_1. As discussed herein, the RF input signal 111 will be propagated through the amplifier package 100 to be provided as RF output signal 119 at a second of the output leads 130_2.

Because both a second input lead 120_2 and a first output lead 130_1 are respectively coupled to an isolated port of the first and second quadrature hybrid couplers 118_1, 118_2, these leads may be externally (e.g., outside the amplifier package 100) coupled to a characteristic impedance 117. In some embodiments, each characteristic impedance 117 may be a 50Ω resistor, but the embodiments of the present disclosure are not limited thereto. In some embodiments, the characteristic impedance 117 may be implemented using something other than a resistor or may have a different impedance value such as, for example, 25Ω, 12.5Ω, or other value.

FIG. 3A illustrates that the amplifier package 100 according to some embodiments of the present disclosure may require less space (and cost) while increasing flexibility. For example, in some configurations, it may be better (e.g., may be less lossy from a performance perspective) to utilize impedances other than 50Ω on interstage matches. With a 12.5Ω or 25Ω impedance, for example, parallel devices could be combined (at lower losses) and then combined again with 2:1 or 4:1 balun transformers, which may then provide another architectural benefit (e.g., even-harmonic cancellation). The amplifier package 100 according to some embodiments of the present disclosure may thus enable superior system designs, e.g., by allowing for customization while still supporting compact package designs.

FIG. 3B illustrates another configuration of the amplifier package 100, according to some embodiments of the present disclosure. The use of input and output leads 120, 130 coupled to the first and second quadrature hybrid couplers 118_1, 118_2 allows for configurations that take advantage of characteristics associated with quadrature hybrid couplers. For example, the isolated port of the first and second quadrature hybrid couplers 118_1, 118_2 may vary depending on which port of the first quadrature hybrid coupler 118_1 receives the RF input signal 111. Thus, if the first input lead 120_1 receives the RF input signal 111, the second input lead 120_2 may be the isolated port (and accordingly coupled to characteristic impedance 117) while the second output lead 130_2 provides the RF output signal 119 and the first output lead 130_1 becomes the isolated port on the output side (and may be accordingly coupled to characteristic impedance 117). Conversely, if the second input lead 120_2 receives the RF input signal 111, the first input lead 120_1 may be the isolated port (and accordingly coupled to characteristic impedance 117) while the first output lead 130_1 provides the RF output signal 119 and the second output lead 130_2 becomes the isolated port on the output side (and may be accordingly coupled to characteristic impedance 117).

The configuration in FIG. 3B utilizes this characteristic behavior to provide additional configuration options for the amplifier package 100. In FIG. 3B, the characteristic impedance 117 or the RF input signal 111 may be alternatively coupled to one of the first input lead 120_1 or second input lead 120_2. The selection of the characteristic impedance 117 or the RF input signal 111 may be controlled, for example, by a switch infrastructure such as that illustrated by switches 140 in FIG. 3B. By utilizing the switch infrastructure, a selection may be made to couple the RF input signal 111 to the first input lead 120_1 and the characteristic impedance 117 to the second input lead 120_2, or to couple the characteristic impedance 117 to the first input lead 120_1 and the RF input signal 111 to the second input lead 120_2.

Similarly, as illustrated in FIG. 3B, the characteristic impedance 117 or the RF output signal 119 may be alternatively coupled to one of the first output lead 130_1 or second output lead 130_2. The selection of the characteristic impedance 117 or the RF output signal 119 may be controlled, for example, by a switch infrastructure such as that illustrated by switches 150 in FIG. 3B. By utilizing the switch infrastructure, a selection may be made to couple the characteristic impedance 117 to the first output lead 130_1 and the RF output signal 119 to the second output lead 130_2, or to couple the RF output signal 119 to the first output lead 130_1 and the characteristic impedance 117 to the second output lead 130_2. In some embodiments, operations of the switches 140 and the switches 150 may be operated so as to control the characteristics of the amplifier package 100 without requiring a reconfiguration of the connections to the amplifier package 100.

The configuration of FIG. 3B allows for increased flexibility in controlling the signal utilized with the amplifier package 100. This flexibility is provided in part, due to the exposure of the ports of the first and second quadrature hybrid couplers 118_1, 118_2 via the input and output leads 120, 130 of the amplifier package 100.

Figure 4A:
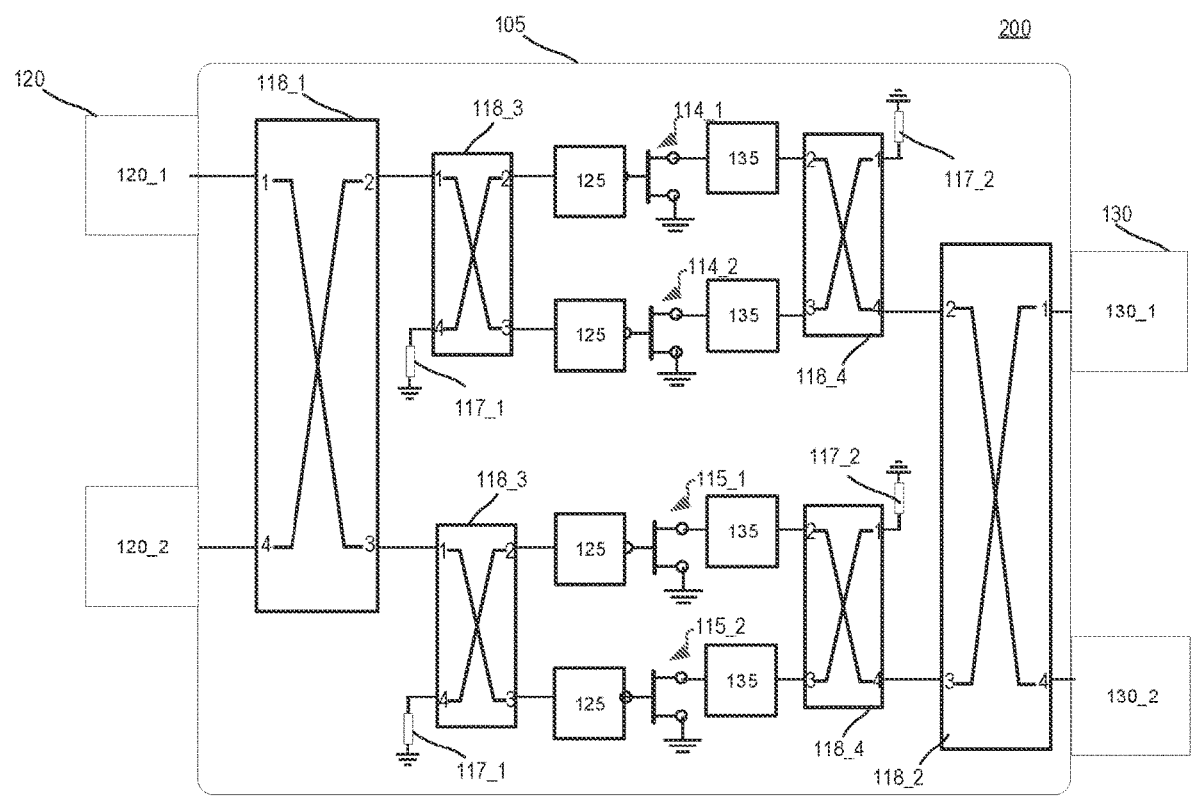
FIGS. 4A and 4B are schematic diagrams of amplifier packages according to additional embodiments of the present disclosure.
Figure 4B:
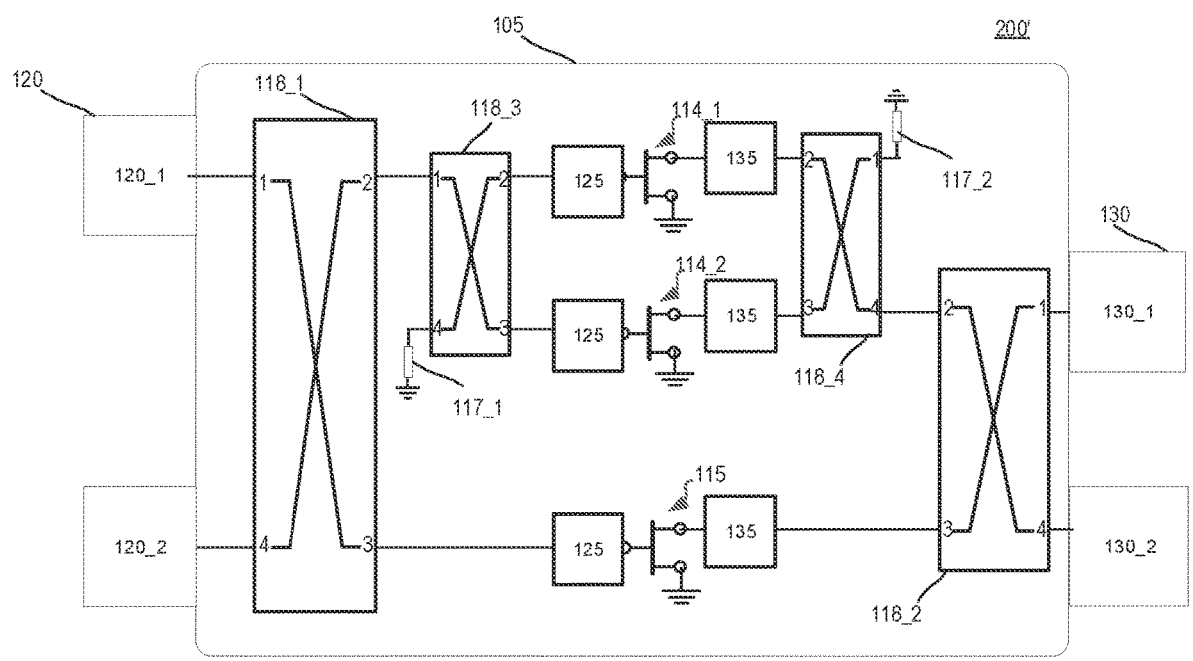

Though the previously-described figures illustrate examples of amplifier packages having two transistor amplifiers and one or two quadrature hybrid couplers, the present disclosure is not limited to such a configuration. FIGS. 4A and 4B are schematic diagrams of amplifier packages according to some embodiments of the present disclosure. A description of elements of FIGS. 4A and 4B that have been previously described with respect to prior figures will be omitted for brevity.

In FIG. 4A, a plurality of quadrature hybrid couplers 118_1, 118_3 are coupled between the input leads 120 and the transistor amplifiers 114_1, 114_2, 115_1, 115_2 of the amplifier package 200, and a plurality of quadrature hybrid couplers 118_4, 118_2 are coupled between the transistor amplifiers 114_1, 114_2, 115_1, 115_2 of the amplifier package 200 and the output leads 130. As illustrated in FIG. 4A, the quadrature hybrid couplers are cascaded on both the input and output sides of the transistors, 114_1, 114_2, 115_1, 115_2.

Referring to FIG. 4A, the input leads 120 may be coupled to a first quadrature hybrid coupler 118_1. For example, a first input lead 120_1 may be coupled to a first port (e.g., an input port) of the first quadrature hybrid coupler 118_1 and a second input lead 120_2 may be coupled to a second port (e.g., an isolated port) of the first quadrature hybrid coupler 118_1.

In some embodiments, a plurality of third quadrature hybrid couplers 118_3 may be coupled between the first quadrature hybrid coupler 118_1 and a plurality of first transistor amplifiers 114_1, 114_2 and a plurality of second transistor amplifiers 115_1, 115_2. For example, one of the plurality of third quadrature hybrid couplers 118_3 may be coupled to a first output port (e.g., port 2) of the first quadrature hybrid coupler 118_1 and another one of plurality of the third quadrature hybrid couplers 118_3 may be coupled to a second output port (e.g., port 3) of the first quadrature hybrid coupler 118_1. An isolated port of each of plurality of third quadrature hybrid couplers 118_3 may be coupled to a first characteristic impedance 117_1. In some embodiments of the present disclosure the first characteristic impedance 117_1 may be disposed on the submount 105 internal to the amplifier package 200, but the embodiments of the present disclosure are not limited thereto. In some embodiments, one or more of the isolated ports of the plurality of the third quadrature hybrid couplers 118_3 may be exposed to a lead of the amplifier package 200 (e.g., to allow for external configuration of the impedance of the plurality of the third quadrature hybrid couplers 118_3).

The output ports of the plurality of the third quadrature hybrid couplers 118_3 may be coupled to a plurality of transistor amplifiers 114_1, 114_2, 115_1, 115_2. For example, the output ports of one of the plurality of the third quadrature hybrid couplers 118_3 that is coupled to a first of the output ports of the first quadrature hybrid coupler 118_1 may be coupled to inputs (e.g., gates) of respective ones of a plurality of first transistor amplifiers 114_1, 114_2. Similarly, the output ports of another one of the plurality of the third quadrature hybrid couplers 118_3 that is coupled to a second of the output ports of the first quadrature hybrid coupler 118_1 may be coupled to inputs (e.g., gates) of respective ones of a plurality of second transistor amplifiers 115_1, 115_2. In some embodiments, input prematch circuits 125 may be respectively coupled between the first and second transistor amplifiers 114_1, 114_2, 115_1, 115_2 and the output ports of the third quadrature hybrid couplers 118_3.

Thus, an input signal provided to the first or second input leads 120_1, 120_2 may pass through the first quadrature hybrid coupler 118_1 and be split between the two output ports of the first quadrature hybrid coupler 118_1. The split signals may then be transmitted through the third quadrature hybrid couplers 118_3 to be split again. The signals from the third quadrature hybrid couplers 118_3 may then be transmitted to the input prematch circuits 125 to the first and second transistor amplifiers 114_1, 114_2, 115_1, 115_2, respectively.

The output leads 130 may be coupled to a second quadrature hybrid coupler 118_2. For example, a first output lead 130_1 may be coupled to a first port (e.g., an isolated port) of the second quadrature hybrid coupler 118_2 and a second output lead 130_2 may be coupled to a second port (e.g., an output port) of the second quadrature hybrid coupler 118_2.

In some embodiments, a plurality of fourth quadrature hybrid couplers 118_4 may be coupled between the second quadrature hybrid coupler 118_2 and the plurality of first transistor amplifiers 114_1, 114_2 and the second transistor amplifiers 115_1, 115_2. For example, one of the plurality of fourth quadrature hybrid couplers 118_4 may be coupled between outputs of the plurality of first transistor amplifiers 114_1, 114_2 and an input port of the second quadrature hybrid coupler 118_2 and another one of the plurality of fourth quadrature hybrid couplers 118_4 may be coupled between outputs of the plurality of second transistor amplifiers 115_1, 115_2 and an input port of the second quadrature hybrid coupler 118_2.

An isolated port of each of plurality of fourth quadrature hybrid couplers 118_4 may be coupled to a second characteristic impedance 117_2. In some embodiments, the first characteristic impedance 117_1 and the second characteristic impedance 117_2 may be the same value. In some embodiments of the present disclosure the second characteristic impedance 117_2 may be disposed on the submount 105 internal to the amplifier package 200, but the embodiments of the present disclosure are not limited thereto. In some embodiments, one or more of the isolated ports of the plurality of the fourth quadrature hybrid couplers 118_4 may be exposed to a lead of the amplifier package 200 (e.g., to allow for external configuration of the impedance of the plurality of the fourth quadrature hybrid couplers 118_4).

The amplifier package 200 illustrated in FIG. 4A provides a balanced amplifier that incorporates a plurality of transistor amplifiers. For example, an input signal provided to an input lead 120 of the amplifier package 200 may be equally split between the plurality of transistor amplifiers by way of the cascaded quadrature hybrid couplers and the output of the transistor amplifiers may be combined by the cascaded quadrature hybrid couplers to provide an RF output signal at an output lead 130. The number of transistor amplifiers and quadrature hybrid coupler illustrated in FIG. 4A is merely an example and is not intended to limit the present disclosure. One of ordinary skill in the art will recognize that additional cascading configuration may be utilized without deviating from the scope of the present disclosure.

The amplifier package 200 illustrated in FIG. 4A is balanced in that the input signal is equally split before being provided to the transistor amplifiers, but the present disclosure is not limited to such a configuration. FIG. 4B illustrates an embodiment of an amplifier package 200' in which the signal is split unequally between the transistor amplifiers.

Referring to FIG. 4B, one of the output signals from the first quadrature hybrid coupler 118_1 may be provided to the third quadrature hybrid coupler 118_3 as in FIG. 4A. However, another of the output signals from the first quadrature hybrid coupler 118_1 may be provided to the second transistor amplifier 115. Assuming that the first quadrature hybrid coupler 118_1 equally splits the input signal, half of the signal power will be provided to the third quadrature hybrid coupler 118_3 and half of the signal power will be provided to the second transistor amplifier 115. The third quadrature hybrid coupler 118_3 will further split the signal such that one quarter of the original input signal is provided to each the plurality of first transistor amplifiers 114_1, 114_2. The output signals of the first transistor amplifiers 114_1, 114_2 and the second transistor amplifier 115 may be combined to provide the output signal to the amplifier package 200'. It will be understood by those of ordinary skill of the art that other configurations of the quadrature hybrid couplers provided internally to the amplifier package 200 are within the scope of the present disclosure.

As discussed herein, the embodiments of the present disclosure may be utilized in any of a number of package formats. FIGS. 5A, 5B, 6A, 6B, 7A, and 7B are schematic cross-sectional views illustrating several example ways that the transistor amplifiers according to embodiments of the present disclosure may be packaged to provide packaged transistor amplifiers. While FIGS. 5A-7B show variations of the amplifier package 100 described herein as an example, it will be appreciated that any of the package configurations according to embodiments of the present disclosure (e.g., amplifier packages 100, 100', 100", 200, 200') may be packaged in the packages illustrated in FIGS. 5A-7B.

Figure 5A:
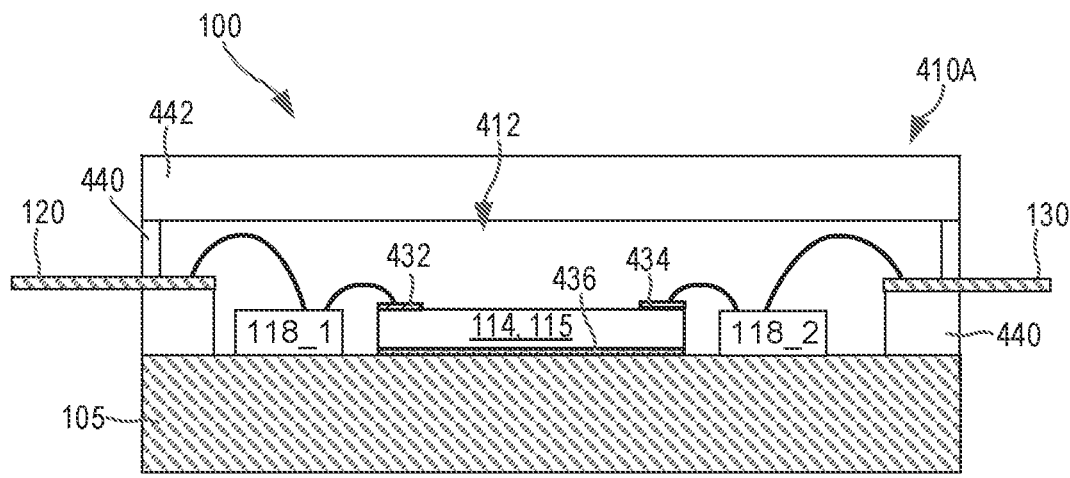
FIGS. 5A, 5B, 6A, 6B, 7A, and 7B are schematic cross-sectional views illustrating several example ways that that the transistor amplifier dies according to embodiments of the present disclosure may be packaged to provide packaged transistor amplifiers.

FIG. 5A is a schematic side view of an amplifier package 100. As shown in FIG. 5A, amplifier package 100 includes one or more transistor amplifier die 114, 115 packaged in an open cavity package 410A. Though only one transistor amplifier die 114, 115 is illustrated in the cross-section, it will be understood that multiple transistor amplifier dies 114, 115 may be present. The package 410A includes metal input leads 120, metal output leads 130, a metal submount 105, sidewalls 440 and a lid 442. Though only one input lead 120 is illustrated in the cross-section, it will be understood that multiple input leads 120 may be present. Similarly, though only one output lead 130 is illustrated in the cross-section, it will be understood that multiple output leads 130 may be present.

The submount 105 may include materials configured to assist with the thermal management of the amplifier package 100. For example, the submount 105 may include copper and/or molybdenum. In some embodiments, the submount 105 may be composed of multiple layers and/or contain vias/interconnects. In an example embodiment, the submount 105 may be a multilayer copper/molybdenum/copper metal flange that comprises a core molybdenum layer with copper cladding layers on either major surface thereof. In some embodiments, the submount 105 may include a metal heat sink that is part of a lead frame or metal slug. The sidewalls 440 and/or lid 442 may be formed of or include an insulating material in some embodiments. For example, the sidewalls 440 and/or lid 442 may be formed of or include ceramic materials. In some embodiments, the sidewalls 440 and/or lid 442 may be formed of, for example, $Al_2O_3$. The lid 442 may be glued to the sidewalls 440 using an epoxy glue. The sidewalls 440 may be attached to the submount 105 via, for example, brazing. The input lead 120 and the output lead 130 may be configured to extend through the sidewalls 440, though embodiments of the present disclosure are not limited thereto.

The transistor amplifier die 114, 115 is mounted on the upper surface of the metal submount 105 in an air-filled cavity 412 defined by the metal submount 105, the ceramic sidewalls 440 and the ceramic lid 442. In some embodiments, a gate terminal 432 and a drain terminal 434 of the transistor amplifier die 114, 115 are on the top side of the transistor amplifier die 114, 115, while a source terminal 436 is on the bottom side of the transistor amplifier die 114, 115. The source terminal 436 may be mounted on the metal submount 105 using, for example, a conductive die attach material (not shown). The metal submount 105 may provide the electrical connection to the source terminal 436 and may also serve as a heat dissipation structure that dissipates heat that is generated in the transistor amplifier die 114, 115. The heat is primarily generated in the upper portion of the transistor amplifier die 114, 115 where relatively high current densities are generated in, for example, the channel regions of the unit cell transistors of the transistor amplifier die 114, 115. This heat may be transferred, for example, though the source vias to the source terminal 436 and then to the metal submount 105. Though not illustrated in FIG. 5A, input prematch circuits 125 and/or output prematch circuit 135 may also be provided on the submount 105.

First quadrature hybrid coupler 118_1 and second quadrature hybrid coupler 118_2 may also be mounted within and/or internal to the amplifier package 100. More than one quadrature hybrid coupler may be provided. As schematically shown in FIG. 5A, the first quadrature hybrid coupler 118_1 and the second quadrature hybrid coupler 118_2 may be mounted on the metal submount 105, as discussed herein. Note that the prematch circuits 125, 135 that include impedance matching and/or harmonic termination circuits are not shown in the figures to simplify the drawings, but may be included in some embodiments.

The input lead 120 may be connected to the first quadrature hybrid coupler 118_1 by one or more bond wires, and the first quadrature hybrid coupler 118_1 may be connected to the gate terminal 432 of transistor amplifier die 114, 115 (and/or to an input prematch circuit if present) by one or more additional bond wires. Similarly, the output lead 130 may be connected to the second quadrature hybrid coupler 118_2 by one or more bond wires, and the second quadrature hybrid coupler 118_2 may be connected to the drain terminal 434 of transistor amplifier die 114, 115 (and/or to an output prematch circuit if present) by one or more additional bond wires. The bond wires, which may be inductive elements in some embodiments, may form part of the input and/or output prematch circuits.

Figure 5B:
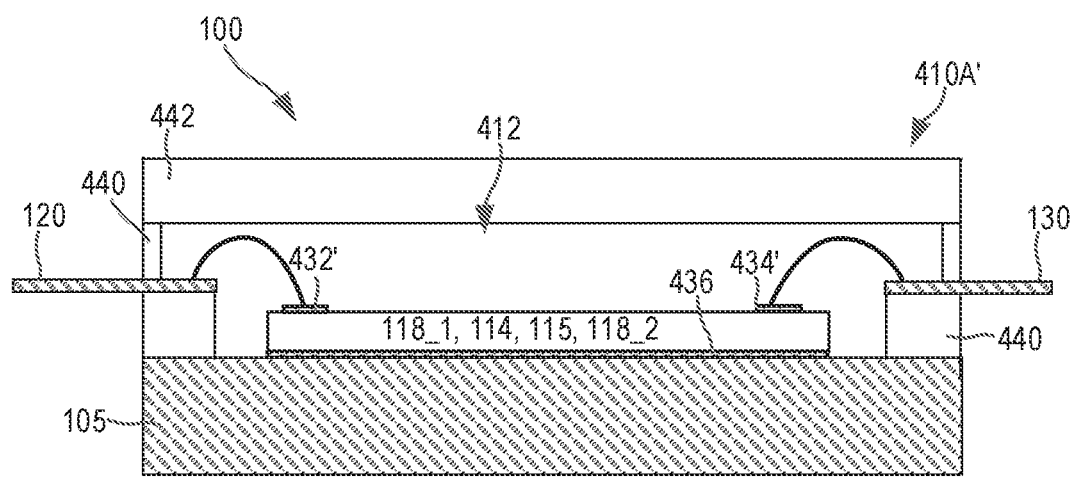

FIG. 5A illustrates an embodiment of an open cavity package 410A in which the transistor amplifier die 114, 115 are provided as separate discrete elements from the first and second quadrature hybrid couplers 118_1, 118_2 within the package. However, the embodiments of the present disclosure are not limited thereto. FIG. 5B illustrates an embodiment of an open cavity package 410A' in which the first and second transistor amplifiers 114, 115 and the first and second quadrature hybrid couplers 118_1, 118_2 are provided as part of a single die. For example, the first and second quadrature hybrid couplers 118_1, 118_2 may be integrated into the same die containing the first and second transistor amplifiers 114, 115.

In such a configuration, the common die containing the first and second quadrature hybrid couplers 118_1, 118_2 and the first and second transistor amplifiers 114, 115 may be provided on the submount 105. Bond wires may be coupled between the input lead 120 and an input terminal 432' of the common die and between the input lead 130 and an output terminal 434' of the common die. It will be recognized that other configurations of the elements of the amplifier package 100 described herein are possible within the open cavity package 410A without deviating from the embodiments of the present disclosure.

Figure 6A:
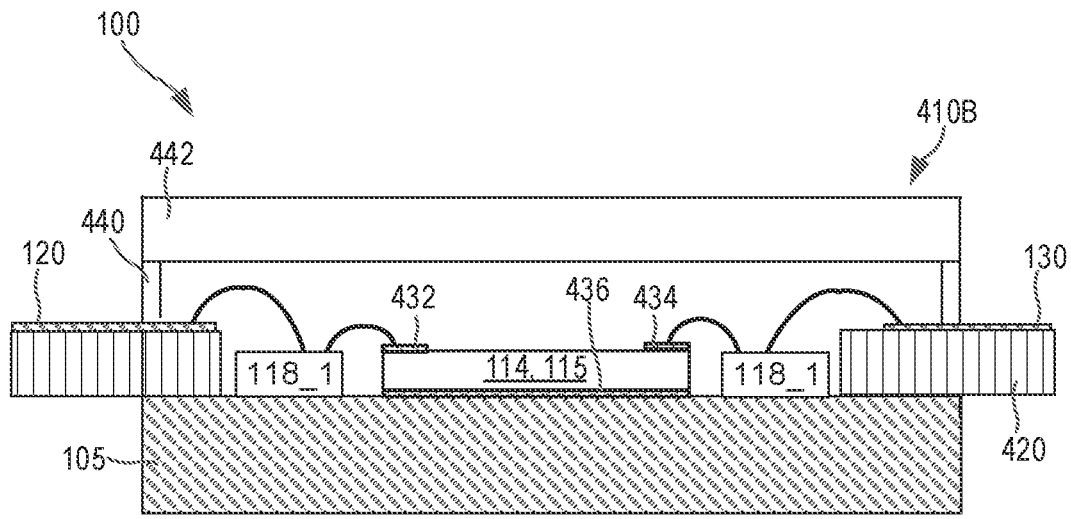

FIG. 6A is a schematic side view of amplifier package 100 that includes the transistor amplifier die 114, 115 packaged in a printed circuit board (PCB) based package 410B. The PCB based package 410B of FIG. 6A is similar to the open cavity package 410A of FIG. 5A, except that the input leads 120 and output leads 130 of the PCB based package 410B are printed circuit board-based leads 120, 130.

The PCB based package 410B includes a submount 105, ceramic sidewalls 440, a ceramic lid 442, each of which may be substantially identical to the like numbered elements of open cavity package 410A discussed above. The PCB based package 410B further includes a printed circuit board 420. Conductive traces on the printed circuit board 420 form an input lead 120 and an output lead 130. The printed circuit board 420 may be attached to the submount 105 via, for example, a conductive glue. The printed circuit board 420 includes a central opening and the transistor amplifier die 114, 115 and/or the first and second quadrature hybrid couplers 118_1, 118_2 are mounted within this opening on the submount 105. In some embodiments, the transistor amplifier die 114, 115 and/or the first and second quadrature hybrid couplers 118_1, 118_2 may be formed on and/or in the printed circuit board 420.

Figure 6B:
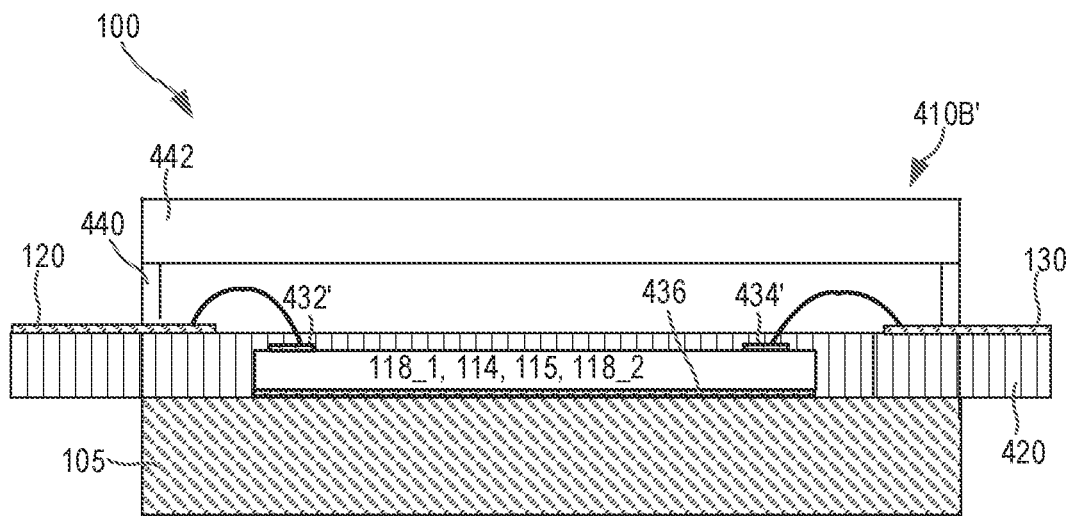

FIG. 6A illustrates an embodiment of a PCB based package 410B in which the transistor amplifier die 114, 115 is provided as a separate discrete element from the first and second quadrature hybrid couplers 118_1, 118_2. FIG. 6B illustrates an embodiment of a PCB based package 410B' in which the first and second transistor amplifiers 114, 115 and the first and second quadrature hybrid couplers 118_1, 118_2 are provided as part of a single die. Other components of the PCB based packages 410B, 410B' may be the same as the like-numbered components of the open cavity packages 410A, 410A' and hence further description thereof will be omitted.

Figure 7A:
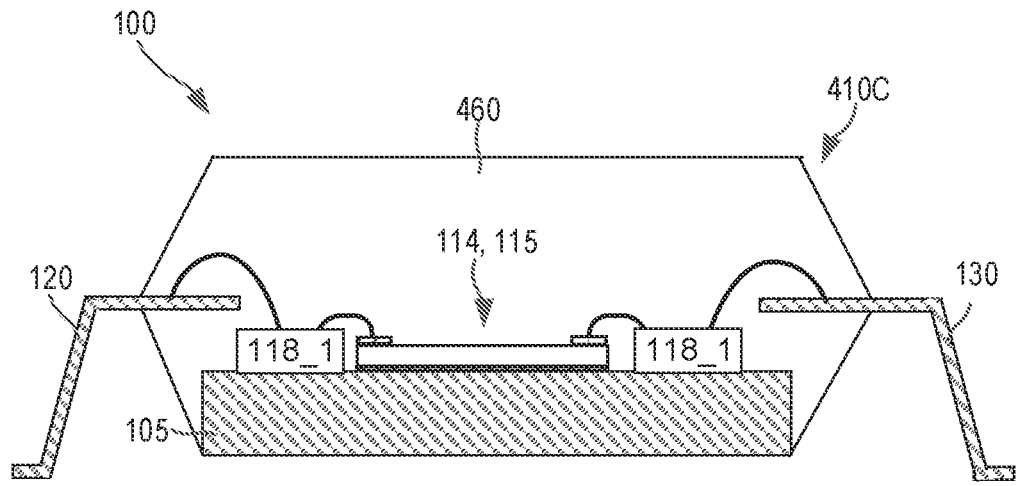

FIG. 7A is a schematic side view of another embodiment of amplifier package 100 incorporated as an overmold plastic (OMP) package 410C. The OMP package 410C includes a metal submount 105 (which may be similar or identical to the like numbered submount 105 of open cavity package 410A), as well as input leads 120 and output leads 130. OMP package 410C also includes a plastic overmold 460 that at least partially surrounds the transistor amplifier die 114, 115, the leads 120, 130, the first and second quadrature hybrid couplers 118_1, 118_2, and the metal submount 105. In some embodiments, the plastic overmold 460 may encapsulate the components of the amplifier package 100 to provide mechanical support and/or protection from the environment. Other components of OMP package 410C may be the same as the like-numbered components of open cavity package 410A and hence further description thereof will be omitted.

Figure 7B:
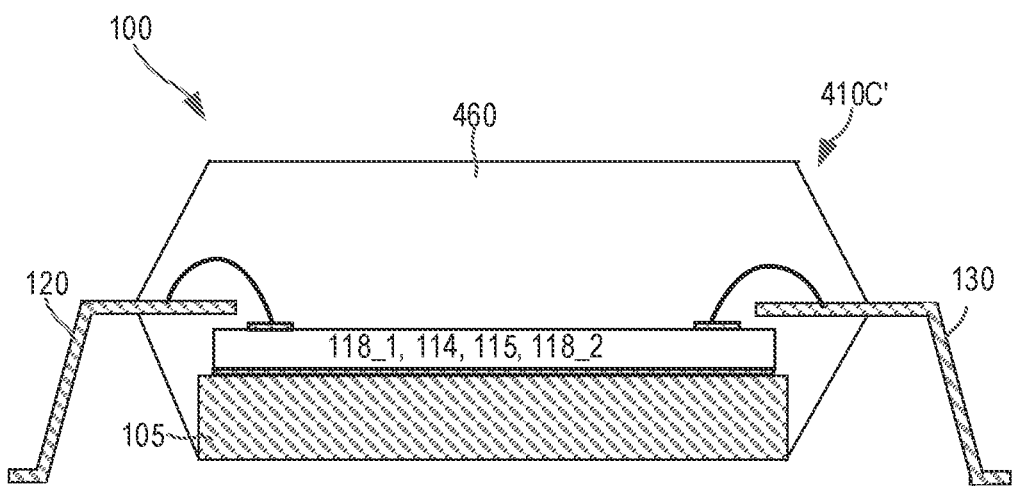

FIG. 7A illustrates an embodiment of an OMP package 410C in which the transistor amplifier die 114, 115 is provided as a separate discrete element from the first and second quadrature hybrid couplers 118_1, 118_2. FIG. 7B illustrates an embodiment of an OMP package 410C' in which the first and second transistor amplifiers 114, 115 and the first and second quadrature hybrid couplers 118_1, 118_2 are provided as part of a single die. Other components of the OMP packages 410C, 410C' may be the same as the like-numbered components of the open cavity packages 410A, 410A' and hence further description thereof will be omitted.

Figure 8:
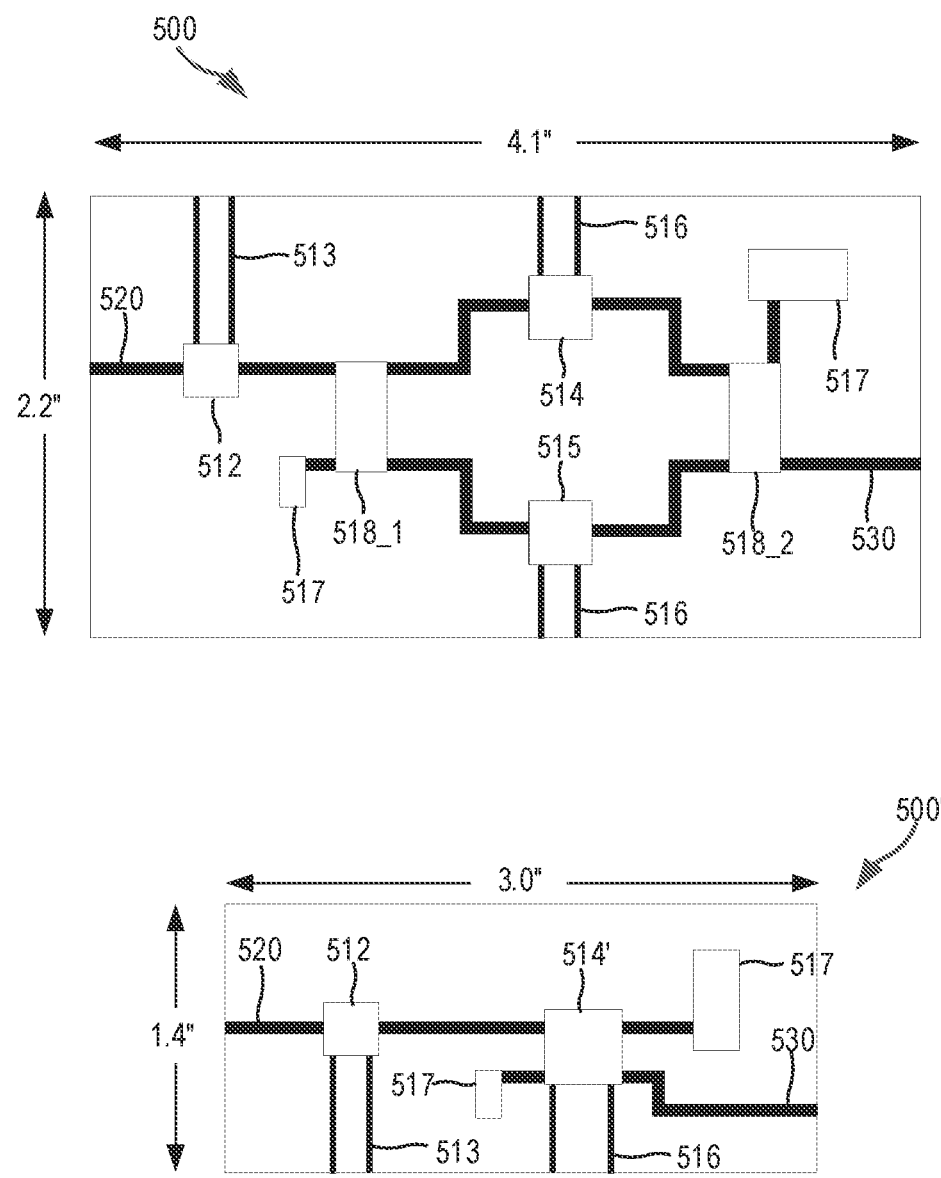
FIG. 8 is a schematic diagram that illustrates the relative sizes of a conventional amplifier package and a comparable amplifier package according to embodiments of the present invention.

FIG. 8 illustrates the space savings that may be obtained using the amplifier packages according to embodiments of the present invention as compared to a comparable conventional amplifier package. In FIG. 8, two amplifier packages are illustrated in schematic plan view, namely a conventional amplifier package 500 and an amplifier package 500' according to embodiments of the present invention.

As shown in FIG. 8, the conventional amplifier package 500 includes an input lead 520, a pre-amplifier semiconductor die 512 having bias inputs 513, a first quadrature hybrid coupler 518_1, a pair of main amplifier semiconductor die 514, 515 having bias inputs 516, a second quadrature hybrid coupler 518_2, and an output lead 530. The input lead 512 is coupled to the input of the preamplifier die 513. The output of pre-amplifier die 513 is coupled to the input port of the first quadrature hybrid coupler 518_1, and a characteristic impedance 517 (e.g., a 50 Ohm resistor) is coupled to the isolated port of the first quadrature hybrid coupler 518_1. The through port of the first quadrature hybrid coupler 518_1 is coupled to the input (gate terminal) of the first main amplifier semiconductor die 514 and the coupled port of the first quadrature hybrid coupler 518_1 is coupled to the input (gate terminal) of the second main amplifier semiconductor die 515. The output of the first main amplifier semiconductor die 514 is coupled to the through port of the second quadrature hybrid coupler 518_2, and the output of the second main amplifier semiconductor die 515 is coupled to the coupled port of the second quadrature hybrid coupler 518_2. The input port of the second quadrature hybrid coupler 518_2 is coupled to the output lead 530, and the isolated port of the second quadrature hybrid coupler 518_2 is coupled to a characteristic impedance 517. As shown in FIG. 8, the conventional amplifier package (excluding the input and output connectors that are coupled to the input and output leads 520, 530, respectively), is about 4.3 inches by 2.2 inches.

As is further shown in FIG. 8, the amplifier package 500' according to embodiments of the present invention includes the input lead 520, the pre-amplifier semiconductor die 512 having bias inputs 513, a semiconductor die 514' that includes a first quadrature hybrid coupler, a pair of main amplifiers, and a second quadrature hybrid coupler, and the output lead 530. The input lead 512 is coupled to the input of the preamplifier die 513. The output of pre-amplifier die 513 is coupled to an input port of semiconductor die 514' that corresponds to the input port of a first quadrature hybrid coupler. A characteristic impedance 517 (e.g., a 50 Ohm resistor) is coupled to an isolated port of semiconductor die 514' that corresponds to the isolated port of the first quadrature hybrid coupler. A through port of the semiconductor die 514' that corresponds to the input port of a second quadrature hybrid coupler is coupled to another characteristic impedance, and a coupled port of the semiconductor die 514' that corresponds to the coupled port of the second quadrature hybrid coupler is coupled to the output lead 530. As shown, the amplifier package 500' according to embodiments of the present invention (excluding the input and output connectors that are coupled to the input and output leads 520, 530, respectively), is about 3 inches by 1.4 inches. Thus, the total area of the amplifier package 500' is less than 50% the total area of the conventional amplifier package 500.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash or underscore, such as 100-1, 100_1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An amplifier package comprising:
    a plurality of input leads;
    a plurality of transistor amplifiers having inputs respectively coupled to one of the plurality of input leads; and
    a quadrature hybrid coupler within the amplifier package and coupled between the plurality of input leads and the plurality of transistor amplifiers, wherein the quadrature hybrid coupler is configured to divide an input signal received from a first of the plurality of input leads between the plurality of transistor amplifiers,
    wherein the quadrature hybrid coupler comprises a plurality of ports, and
    wherein none of the ports of the quadrature hybrid coupler are terminated within the amplifier package.

2. The amplifier package of claim 1, wherein the amplifier package comprises an overmold plastic (OMP) package.

3. The amplifier package of claim 1, further comprising a submount,
    wherein the plurality of transistor amplifiers and the quadrature hybrid coupler are on the submount.

4. The amplifier package of claim 1,
    wherein a first port of the plurality of ports is coupled to the first of the plurality of input leads and a second port of the plurality of ports is coupled to a second of the plurality of input leads.

5. The amplifier package of claim 4, wherein the second port of the plurality of ports is an isolated port of the quadrature hybrid coupler.

6. The amplifier package of claim 1, further comprising an input prematch circuit between the quadrature hybrid coupler and a first transistor amplifier of the plurality of transistor amplifiers.

7. The amplifier package of claim 1, wherein the quadrature hybrid coupler is a first quadrature hybrid coupler, and wherein the amplifier package further comprises:
a plurality of output leads; and
a second quadrature hybrid coupler within the amplifier package and coupled between the plurality of output leads and the plurality of transistor amplifiers, wherein the second quadrature hybrid coupler is configured to combine an output signal received from the plurality of transistor amplifiers.

8. The amplifier package of claim 7, wherein the second quadrature hybrid coupler comprises a plurality of ports, and wherein a first port of the plurality of ports is coupled to the first of the plurality of output leads and a second port of the plurality of ports is coupled to a second of the plurality of output leads.

9. The amplifier package of claim 1, wherein the quadrature hybrid coupler is a first quadrature hybrid coupler, and wherein the amplifier package further comprises:
a second quadrature hybrid coupler within the amplifier package and coupled between the first quadrature hybrid coupler and a subset of the plurality of transistor amplifiers, wherein the second quadrature hybrid coupler is configured to divide an output signal received from the first quadrature hybrid coupler between the subset of the plurality of transistor amplifiers.

10. An amplifier package comprising:
a first input lead and a second input lead;
a submount;
a first transistor amplifier and a second transistor amplifier on the submount; and
a quadrature hybrid coupler on the submount, the quadrature hybrid coupler comprising an input port, a first output port, a second output port, and an isolated port, wherein the input port is coupled to the first input lead, the isolated port is coupled to the second input lead, the first output port is coupled to the first transistor amplifier, and the second output port is coupled to the second transistor amplifier, and
wherein the isolated port is terminated by a characteristic impedance that is external to the amplifier package.

11. The amplifier package of claim 10, further comprising an input prematch circuit between the first output port of the quadrature hybrid coupler and the first transistor amplifier.

12. The amplifier package of claim 10, wherein the quadrature hybrid coupler is a first quadrature hybrid coupler and the characteristic impedance is a first characteristic impedance, and
wherein the amplifier package further comprises:
a first output lead and a second output lead; and
a second quadrature hybrid coupler on the submount, the second quadrature hybrid coupler comprising a first input port, a second input port, an output port, and an isolated port, wherein the first input port of the second quadrature hybrid coupler is coupled to the first transistor amplifier, the second input port of the second quadrature hybrid coupler is coupled to the second transistor amplifier, the isolated port of the second quadrature hybrid coupler is coupled to the first output lead, and the output port of the second quadrature hybrid coupler is coupled to the first output lead, and
wherein the isolated port of the second quadrature hybrid coupler is terminated by a second characteristic impedance that is external to the amplifier package.

13. The amplifier package of claim 12, further comprising an output prematch circuit between the first input port of the second quadrature hybrid coupler and the first transistor amplifier,
wherein the first characteristic impedance has a value of less than 50 ohms.

14. The amplifier package of claim 10, wherein the quadrature hybrid coupler is a first quadrature hybrid coupler,
wherein the first transistor amplifier is a plurality of first transistor amplifiers, and
wherein the amplifier package further comprises:
a second quadrature hybrid coupler within the amplifier package and coupled between the first quadrature hybrid coupler and the plurality of first transistor amplifiers, wherein the second quadrature hybrid coupler is configured to divide an output signal received from the first quadrature hybrid coupler between respective ones of the plurality of first transistor amplifiers.

15. The amplifier package of claim 10, wherein the amplifier package comprises an overmold plastic (OMP) package in which an overmold material at least partially encapsulates the first transistor amplifier, the second transistor amplifier, and the quadrature hybrid coupler.

16. The amplifier package of claim 10, wherein the isolated port is configured to output signal reflections from the first output port and the second output port.

17. An amplifier package coupled to an external characteristic impedance, the amplifier package comprising:
a plurality of input leads and a plurality of output leads;
a plurality of transistor amplifiers internal to the amplifier package; and
a plurality of quadrature hybrid couplers internal to the amplifier package and coupled to the plurality of transistor amplifiers, each of the plurality of quadrature hybrid couplers comprising an isolated port coupled to one of the plurality of input leads or one of the plurality of output leads, wherein the one of the plurality of input leads or the one of the plurality of output leads is coupled between the isolated port and the external characteristic impedance.

18. The amplifier package of claim 17, wherein the amplifier package comprises an overmold plastic (OMP) package.

19. The amplifier package of claim 17, further comprising a submount,
wherein the plurality of transistor amplifiers and the plurality of quadrature hybrid couplers are on the submount.

20. The amplifier package of claim 17, wherein the plurality of quadrature hybrid couplers comprises a first quadrature hybrid coupler and a second quadrature hybrid coupler, each comprising a plurality of ports,
wherein a first port of the plurality of ports of the first quadrature hybrid coupler is coupled to the one of the plurality of input leads and a second port of the plurality of ports of the first quadrature hybrid coupler is coupled to another one of the plurality of input leads, and
wherein a first port of the plurality of ports of the second quadrature hybrid coupler is coupled to the one of the plurality of output leads and a second port of the plurality of ports of the second quadrature hybrid coupler is coupled to another one of the plurality of output leads.

21. The amplifier package of claim 20, wherein the second port of the plurality of ports of the first and second quadrature hybrid coupler is an isolated port.

22. The amplifier package of claim 20, further comprising:
- an input prematch circuit between the first quadrature hybrid coupler and a first transistor amplifier of the plurality of transistor amplifiers; and
- an output prematch circuit between the second quadrature hybrid coupler and the first transistor amplifier of the plurality of transistor amplifiers.

* * * * *